United States Patent [19]

Koizumi

[11] Patent Number: 5,593,223
[45] Date of Patent: Jan. 14, 1997

[54] ILLUMINATION DEVICE

[75] Inventor: Hiroyuki Koizumi, Jouban Iwaki, Japan

[73] Assignee: Alpine Electronics, Inc., Tokyo, Japan

[21] Appl. No.: 534,613

[22] Filed: Sep. 27, 1995

[30]     Foreign Application Priority Data

Oct. 13, 1994   [JP]   Japan .................................. 6-274598

[51] Int. Cl.$^6$ ..................................................... F21M 3/14
[52] U.S. Cl. ........................... 362/255; 362/326; 362/375; 362/800
[58] Field of Search ..................................... 362/255, 326, 362/375, 800

[56]            References Cited

U.S. PATENT DOCUMENTS

| | | | |
|---|---|---|---|
| 4,195,330 | 3/1980 | Savage, Jr. | 362/226 |
| 4,959,761 | 9/1990 | Critelli et al. | 362/226 |
| 5,113,329 | 5/1992 | Lin | 362/238 |

Primary Examiner—Ira S. Lazarus
Assistant Examiner—Alfred Basichas
Attorney, Agent, or Firm—Guy W. Shoup; Patrick T. Bever

[57]                ABSTRACT

An illumination device consists of a light emitting element, a casing for supporting the light emitting element, and a colored cap which covers the light emitting element. The cap has a flat top surface so that the device can be held by suction stably at the top surface by means of a suction nozzle that is used commonly for other electronic parts and can be carried and mounted on a circuit board by the automatic part mounting equipment. The cap also has the formation of a curving surface section between the flat top surface and cylindrical section so that an increased amount of light is transmitted in the up-oblique direction through the curving surface section, thereby compensating the degraded light distribution caused by the formation of the flat top surface.

7 Claims, 6 Drawing Sheets

ILLUMINATION DEVICE

BACKGROUND OF THE INVENTION

1. Field of the Invention

The present invention relates to an illumination device for illuminating the operation panel of electronic instruments installed on vehicles for example, and particularly to an illumination device which can be mounted on a circuit board by being held by suction at the top surface of the cap which is fitted on the light emitting element such as a lamp.

2. Description of the Related Art

FIG. 6 is a cross-sectional view of a conventional illumination device. The illumination device A, which is disposed behind the operation panel (nose section) of a vehicle-installed electronic instrument, is used to illuminate from inside the operation keys and indicators attached and formed on the panel.

Conventional illumination devices of this type have been designed such that lead terminals 4 of a light emitting element 2 such as a lamp are soldered by being led out through a through-hole of a circuit board B. However, the structure that requires the insertion of the lead terminals 4 in the through-hole is not satisfactory in the efficiency of mounting the light emitting element 2 on the circuit board B. On this account, the illumination device A shown in FIG. 6 is provided with a casing 1 for supporting the light emitting element 2, and the casing 1 is mounted flatly on the surface of the circuit board B.

The casing 1 is made of hard resin, with a cavity-shaped holding section 1a being formed at the center. A through-hole 1d is formed in the bottom of holding section 1a of the casing 1. Grooves 1b are formed to run across the bottom and side walls of the casing 1 and merge with the through-hole 1d.

The light emitting element 2 is held in the holding section 1a. Lead terminals 4 of the light emitting element 2 are led out through the through-hole 1d and seated by being bent in the grooves 1b, and have their end sections hooked on the shoulder 1e of the casing 1.

A colored cap 5 is fitted in contact with the side surfaces of the light emitting element 2 and the holding section 1a of the casing 1. The cap 5 is made of soft synthetic resin and colored in a red-like or blue-like color. The cap 5 transmits part of the white light emitted by the light emitting element 2 to create the illumination light of the cap color.

The illumination device A is placed on the circuit board B, with its bottom surface of casing 1 being in contact with lands L of conductor strips formed on the circuit board B, and the lead terminals 4 which are exposed to the exterior of the bottom and side walls of the casing 1 are soldered to the lands L. The soldering work is based on the reflowing process using cream solder (paste solder).

However, although the illumination device A shown in FIG. 6 is designed to be mounted flatly at the bottom surface of casing 1 on the circuit board B, the working efficiency of mounting the casing 1 on the lands L of conductor strips by hand is unsatisfactory.

It is desirable to carry the illumination device A to the position over the lands L of the circuit board B by holding by suction the casing 1 or cap 5 of the device using a vacuum suction nozzle of automatic part mounting equipment used commonly for mounting other parts such as IC devices. The conventional illumination device A shown in FIG. 6, however, has a dome-shaped top section (a) of the cap 5, and therefore it is difficult for the vacuum suction nozzle to hold the dome-shaped top section (a) unless it has a special nozzle shape.

One possible solution is using a vacuum suction nozzle 6 having an inner diameter set approximately equal to the outer diameter of the cap 5 so that it holds by suction the outer surface (b) of the cap 5. However, the presence of a gap between the outer surface of the cap 5 and the inner surface of the nozzle is inevitable, and it is difficult to hold the cap 5 by suction stably.

Another possible solution is using a suction nozzle 7 having a sufficiently large inner diameter so that it holds by suction the upper surface (c) of the casing 1. This scheme provides the more stable suction holding as compared with using the nozzle 6 mentioned above. However, suction nozzle 7 is liable to hit other electronic parts mounted around the illumination device A due to its outer diameter jutting out from the side wall of the casing 1.

SUMMARY OF THE INVENTION

The present invention is intended to overcome the foregoing prior art deficiencies, and its prime object is to provide a illumination device which can be held by suction at its cap top by means of a suction nozzle that is used commonly for other electronic parts. The invention resides in an illumination device which comprises a light emitting element, a casing which supports the light emitting element, and a cap which covers the light emitting element, with the cap having a flat external top surface and is designed to be mounted on a circuit board at the bottom of the case.

For the mounting of the casing on a circuit board, it is desirable for the casing to be mounted flatly at its bottom surface or side surface on lands of conductor strips formed on the circuit board, though the casing may be mounted by having its terminal lugs inserted resiliently in a through-hole formed in the circuit board.

The cap has a cylindrical section which covers the light emitting element, and preferably a curving surface section is formed between the cylindrical section and the edge of flat top surface which has a diameter smaller than the outer diameter of the cylindrical section, with the curving surface section having its inner and outer surfaces formed in arcuate profiles with certain radiuses of curvature in a longitudinal cross section on a plane which includes the central axis of the cylindrical section.

Based on this profile of the cap which covers the light emitting element, it is possible for a suction nozzle that deals with general electronic parts such as IC devices to hold by suction the flat top surface of the cap stably, carry the illumination device to a position over the circuit board, and mount it on the board easily and reliably.

In the case of a cap having only a cylindrical section and flat top section, the cylindrical section has a larger incident angle of the light from the light emitting element, resulting in a reduced light transmission in this portion of the cap. The light distribution by the cap can be improved by providing a curving surface section between the cylindrical section and flat top section so that the amount of light transmission in the upward oblique direction from the light emitting element increases.

DETAILED DESCRIPTION OF THE PREFERRED EMBODIMENTS

The embodiments of this invention will be explained with reference to the drawings.

Figure 1:
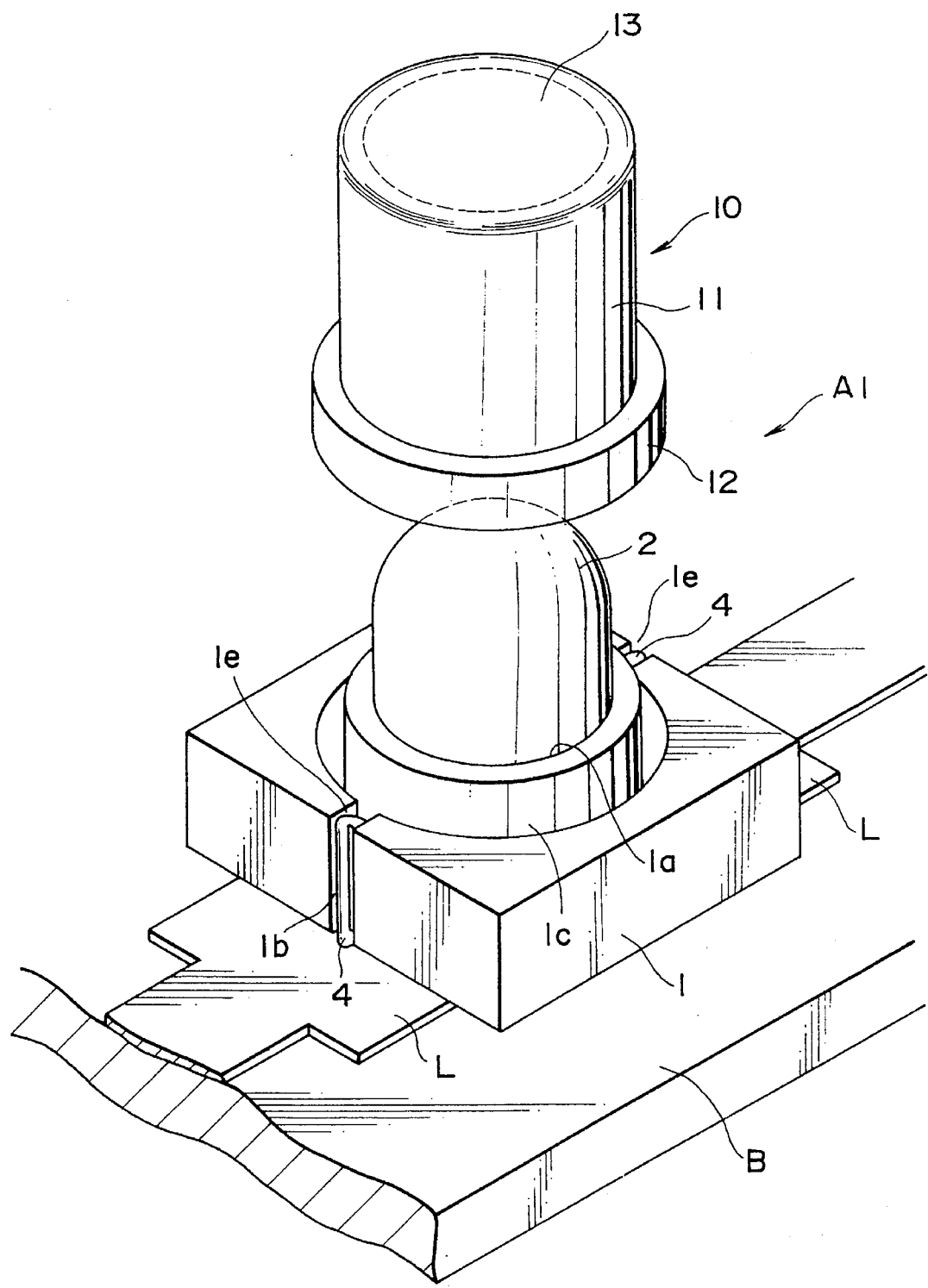
FIG. 1 is an exploded perspective view of the illumination device based on a first embodiment of this invention.
Figure 2:
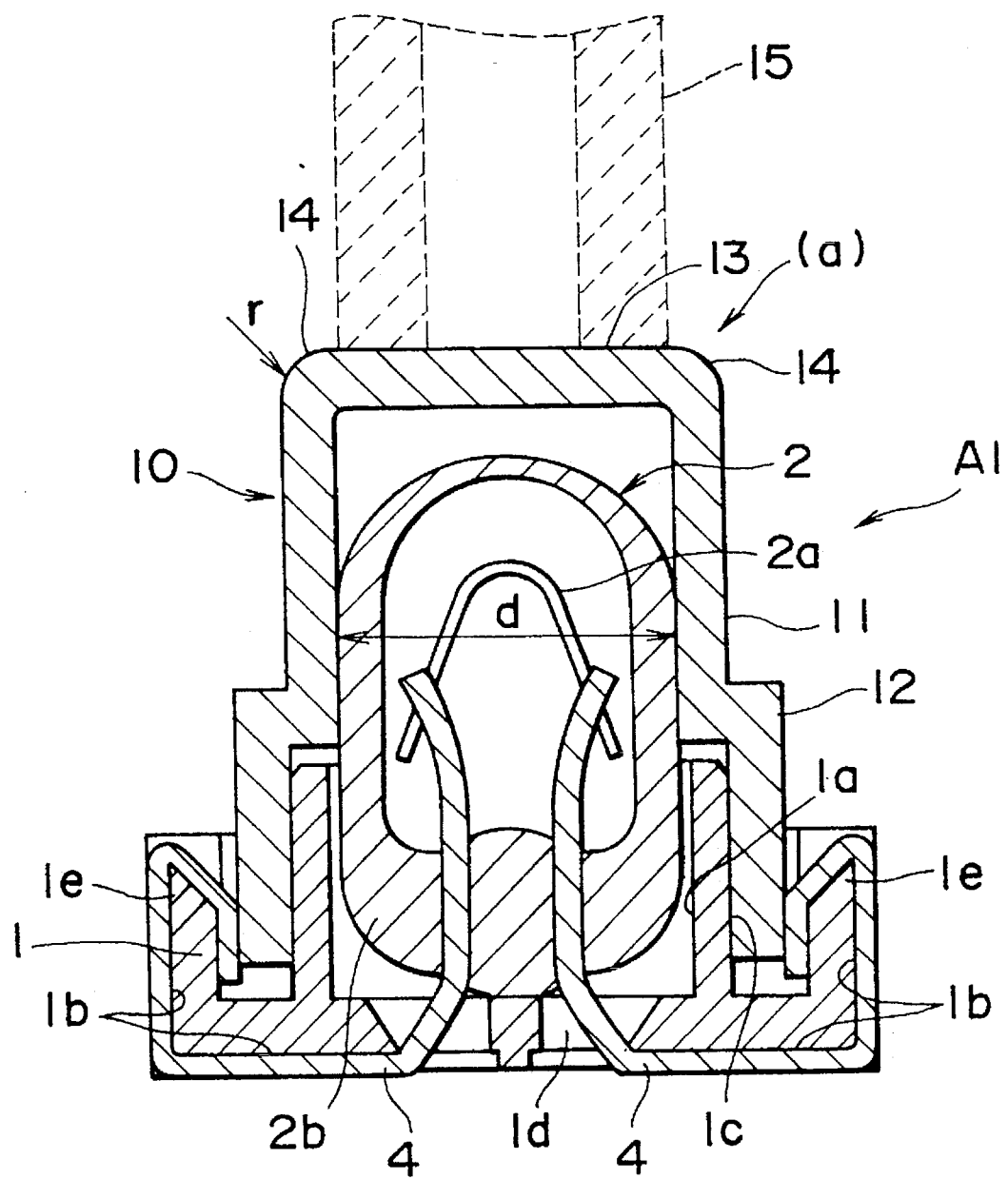
FIG. 2 is a longitudinal cross-sectional view of the illumination device.
Figure 6:
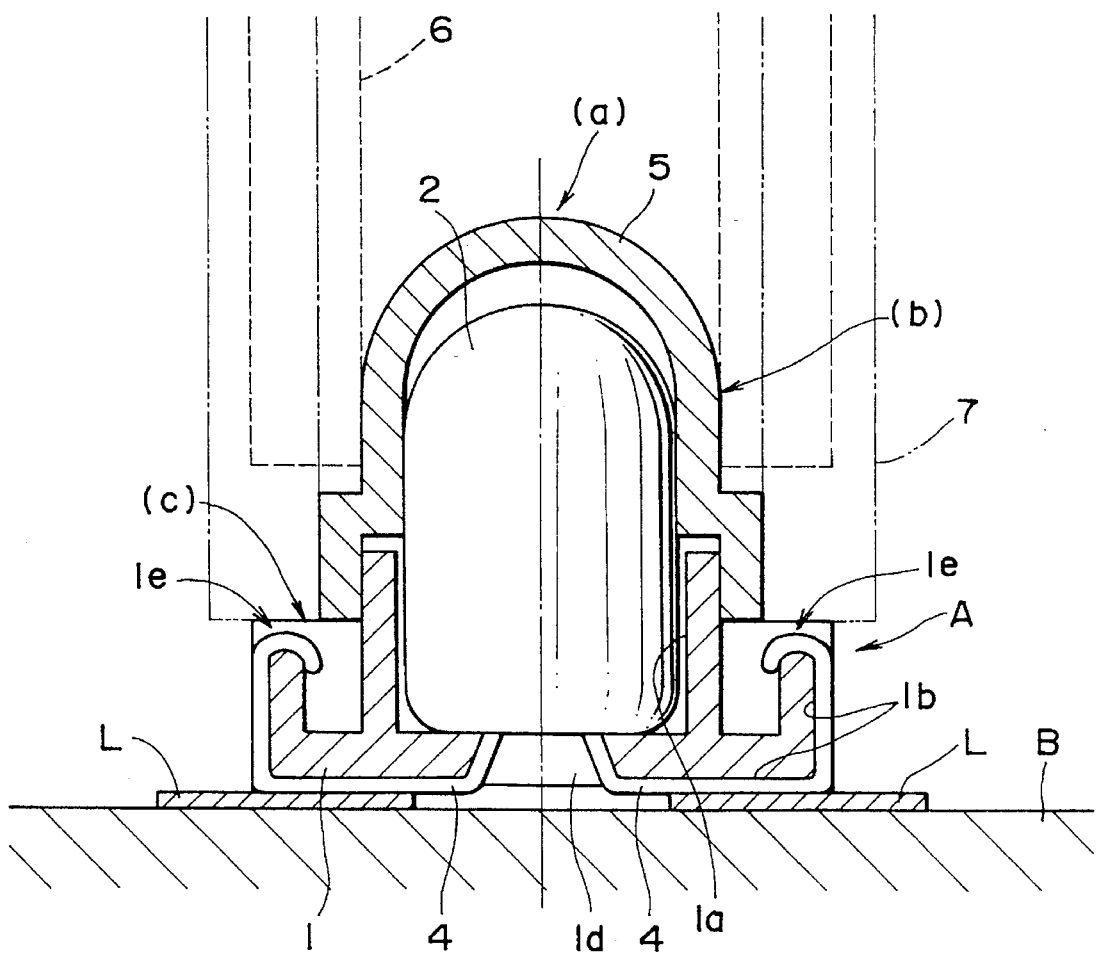
FIG. 6 is a cross-sectional view of the conventional illumination device.

FIG. 1 and FIG. 2 are an exploded perspective view and cross-sectional view of the illumination device based on the first embodiment of this invention. The illumination device A1 of this embodiment has the same casing 1 and light emitting element 2 as those of the conventional device shown in FIG. 6.

The casing 1 of hard resin has the formation of a cavity-shaped holding section 1a. A through-hole 1d is formed at the bottom of the holding section 1a. Grooves 1b are formed to run across the bottom and side walls of the casing 1 and merge with the through-hole 1d.

The light emitting element 2, which is a lamp formed of a vacuum bulb of transparent glass, having a diameter D of about 3.0mm, is inserted in the holding section 1a. A pair of lead terminals 4, with a filament 2a being attached therebetween inside the bulb, come out at the sealing section 2b of the bulb.

The lead terminals 4 of the light emitting element 2 are led out through the through-hole 1d of the holding section 1a and seated by being bent in the grooves 1b, and their end sections are hooked on shoulder 1e of the casing 1.

A cap 10 is made of soft synthetic resin and colored in a red-like or blue-like color. The white light emitted by the light emitting element 2 passes through the cap 10 to create the illumination light of the red-like or blue-like color.

The cap 10 has a cylindrical section 11, which covers the light emitting element 2 having a diameter of d by being generally in contact with the surface of the light emitting element 2, and a cylindrical socket section 12 which takes up the lower portion of the cap 10 and has an inner diameter slightly smaller than the outer diameter of the cylindrical section 1c which forms the holding section 1a of the casing 1. The cap 10 is attached to the casing 1 by having its socket section 12 put resiliently on the cylindrical section 1c.

In the first embodiment shown in FIG. 1 and FIG. 2, virtually the entire top section (a) of the cap 10 is shaped in a flat surface 13. Accordingly, the cap 10 has its external surface of the portion for covering the light emitting element 2 made up of the cylindrical section 11 and flat top surface 13, with the external border section r between the cylindrical section 11 and flat top surface 13 being rounded by a small radius of curvature (around 0.5 to 0.8 mm).

The illumination device A1 is mounted flatly at the bottom of casing 1 on lands L of conductor strips formed on the circuit board B as shown in FIG. 1. For mounting the illumination device A1, a vacuum suction nozzle 15 which is shaped to hold by suction the flat top surface 13 of the cap 10 is used as shown in FIG. 2. The automatic part mounting equipment operates on the suction nozzle 15 to hold the flat top surface 13 of the cap 10 and carries the assembled illumination device A1 shown in FIG. 2 to the lands L on the circuit board B.

A pattern of cream solder (paste solder) is formed in advance on the lands L of conductor strips on the circuit board B. The casing 1 is placed adhesively at its bottom surface on the lands L coated with the cream solder. Alternatively, the casing 1 may be glued at its bottom surface to the circuit board B.

After the casing 1 and all other circuit parts have been mounted on the circuit board B, the circuit board B is placed in the oven, and the cream solder melts to connect the lead terminals 4 to the lands L.

Figure 3:
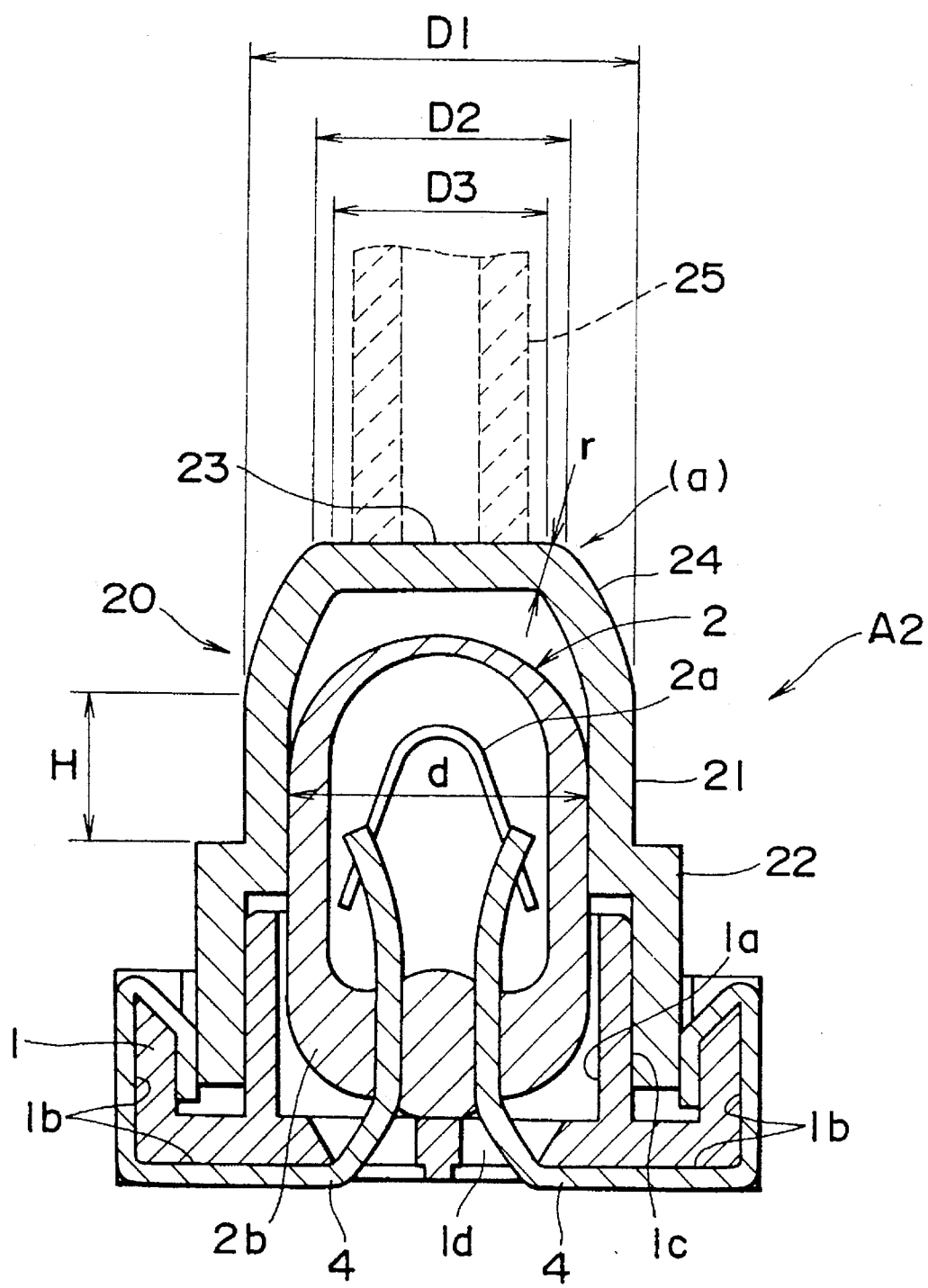
FIG. 3 is a longitudinal cross-sectional view of the illumination device based on a second embodiment of this invention.

FIG. 3 shows the longitudinal cross section of the illumination device A2 based on the second embodiment of this invention. In this embodiment, the casing 1 and light emitting element 2 are the same as those of the first embodiment. The illumination device A2 has a cap 20, which is identical in the material and color, but different in the shape from the cap 10 of the first embodiment.

The cap 20 has a cylindrical section 21 which has a height H of about 1.5 mm and is generally in contact with the surface of the light emitting element 2 having a diameter of d (about 3.0 mm), and a cylindrical socket section 22 which takes up the lower portion of the cap 20 and serves to attach the cap 10 resiliently to the cylindrical section 1c of the casing 1.

The cap 20 has its top section (a) shaped externally in a flat surface 23, which has a diameter D3, e.g., 2.5 to 3.0 mm, smaller than the outer diameter D1, e.g., 4.0 mm, of the cylindrical section 21. A curving surface section 24 is formed to extend from the upper end of the cylindrical section 21 to the diameter D2 of the flat top section (a). The outer surface of the curving surface section 24 has an arcuate profile with a radius of curvature R (e.g., 3 to 4 mm) in the cross section on a plane which includes the central axis of the cylindrical section 21. The curving surface section 24 also has an inner arcuate surface having a certain radius of curvature.

The flat top surface 23 with the diameter D3 and the curving surface section 24 with an inner diameter D2 share a rounded border section having a radius of curvature r of 0.4 to 0.5 mm.

The illumination device A2 is held by suction at its flat top surface 23 formed in the flat top section (a) by a suction nozzle 25 having a smaller diameter as shown in FIG. 3, carried to lands L of conductor strips formed on a circuit board B as shown in FIG. 1, and soldered to the lands L.

The illumination devices A1 and A2 of the embodiments shown in FIG. 2 and FIG. 3 are held at the flat top surface 13 or 23 of the cap 10 or 20 by the suction nozzle 15 or 25 that is not required to have a special shape, and therefore a usual suction nozzle for dealing with general electronic parts such as IC devices can be used. It becomes possible for the suction nozzle 15 or 25, which holds the flat surface 13 or 23 at the top (a) of the cap, to stably hold by suction and carry the assembled illumination device shown in FIG. 2 or FIG. 3 to a position on the circuit board B.

However, the shape of the cap of these illumination devices A1 and A2 has the influence on the distribution of the light which is derived from the white light of the light emitting element 2 and transmitted by the colored cap 10 or 20.

Figure 4:
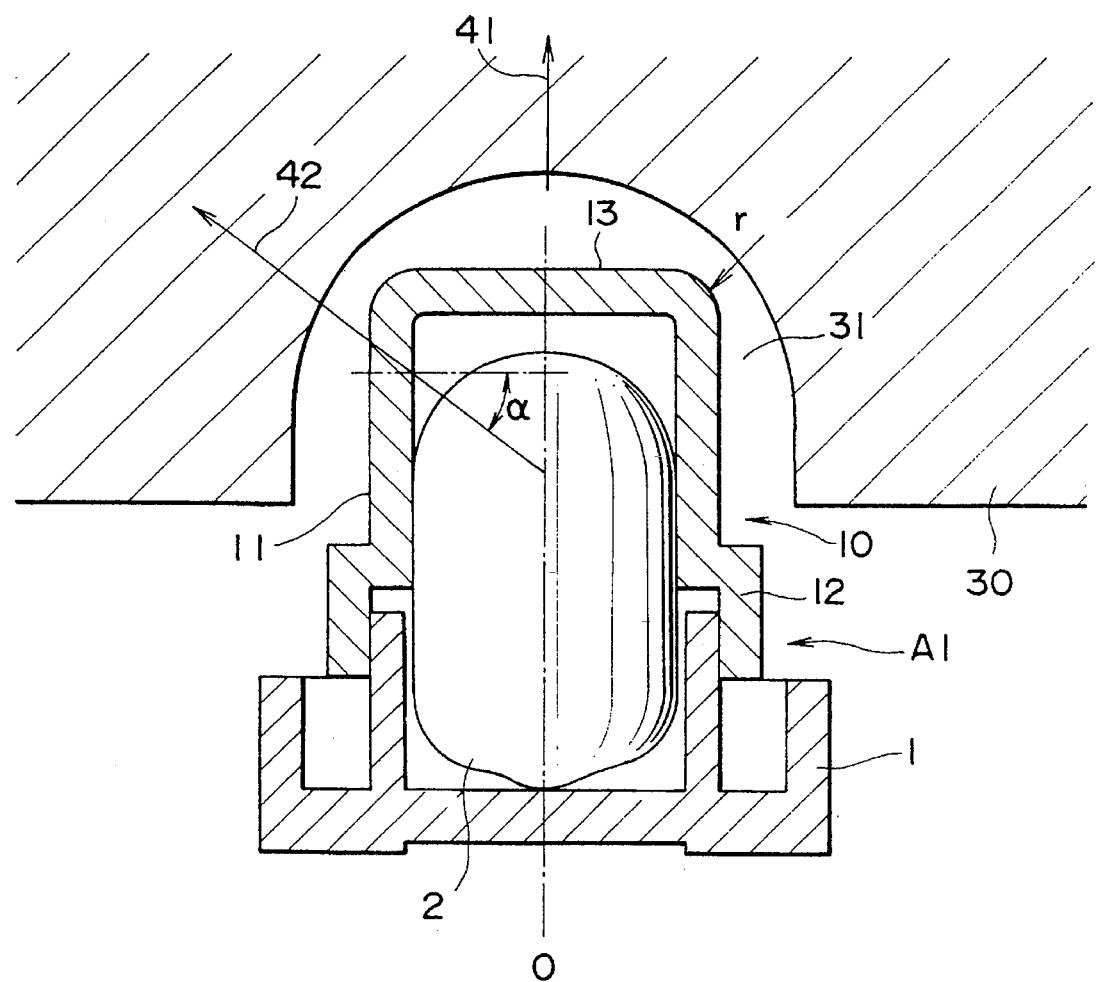
FIG. 4 is a view used to explain the light transmission characteristics of the illumination device of the first embodiment.
Figure 5:
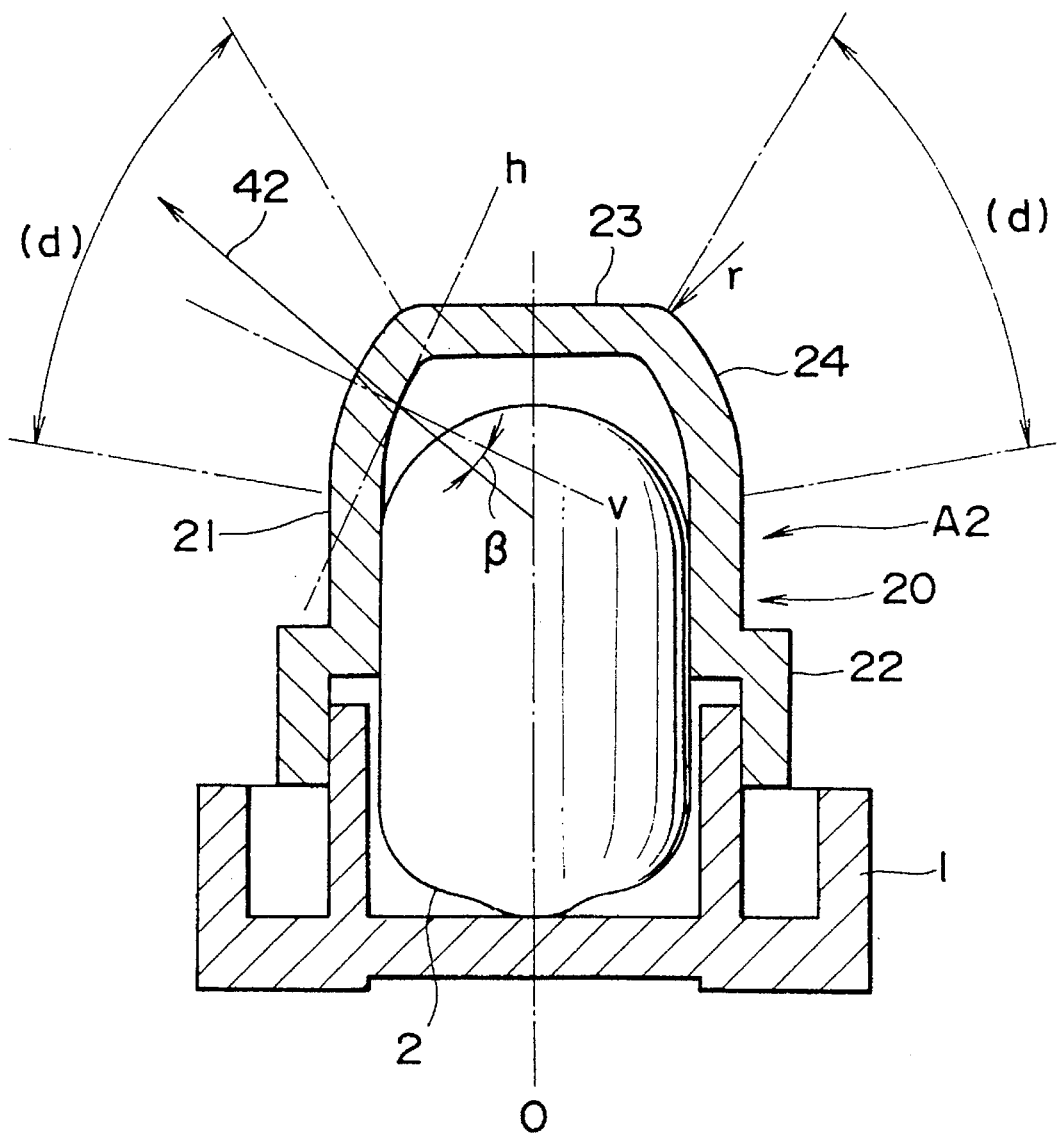
FIG. 5 is a view used to explain the light transmission characteristics of the illumination device of the second embodiment.

FIG. 4 and FIG. 5 show the light transmission characteristics of the illumination devices A1 and A2 of the first and second embodiments.

In many cases of the operation panel of vehicle-installed electronic instruments, the illumination device is confronted by a recessed section 31 of a light conduction member 30 made of transparent resin as shown in FIG. 4. The light from the illumination device is incident to the light conduction member 30 and propagated in it so that the light reaches a wide area of the conduction member 30 for illumination.

In the illumination device A1 of the first embodiment shown in FIG. 4, the cap 10 has its portion of covering the light emitting element (lamp) 2 mostly made up of the cylindrical section 11 and flat top section 13. Among the light emitted by the light emitting element 2, a light component 41 along the central axis O of the cylindrical section 11 is incident perpendicularly to the flat top section 13, and it has a high light transmission efficiency through the cap 10. Another light component 42 from the light emitting element 2 in the upward-oblique direction is incident at a relatively large angle α to the inner surface, which is generally parallel to the central axis O, of the cylindrical section 11, and it has a low transmission efficiency the cap 10 due to the partial reflection on the inner surface.

In the illumination device A2 of the second embodiment shown in FIG. 5, the light emitting element 2 is covered at the portion around the top by the curving surface section 24 of cap 20 having a certain radius of curvature. In FIG. 5, the light component 42 as shown in FIG. 4 is incident at a smaller angle β to the inner surface of the curving surface section 24 of the cap 20, resulting in a reduced reflection, and it has a higher transmission efficiency. Accordingly, the degradation of light distribution caused by the formation of the flat top surface 23 of the cap 20 can be minimized. In FIG. 5, indicated by h is the tangent at the incident point on the inner surface of the curving surface section 24, and v is the normal at the point.

Consequently, the illumination device A2 of FIG. 5 has improved light transmission in the range of area around the top indicated by (d) as compared with the illumination device A1 of FIG. 4. The illumination device A2 is superior to the A1 in the property of even light distribution about the central axis O. Particularly, when the light conduction member 30 as shown in FIG. 4 is used, in which case the light must be fed as much as possible to a wide range of the member 30, the use of the illumination device A2 of FIG. 5 is advantageous.

In regard to the property of light distribution, it is desirable to make the flat top surface 23 having as small diameter D3 as possible, preferably 2.5 mm or smaller, so as to obtain a larger curving surface section 24, though the lower limit is 1.5 to 2.0 mm in order for the illumination device A2 to be held by suction.

The illumination device A1 of FIG. 4 has a larger amount of light transmission of the light component 41 parallel to the central axis O, in exchange for the slightly inferior light distribution, as compared with the illumination device A2 of FIG. 5. On this account, in the case of an illumination system intended to concentrate the light along the central axis O, the illumination device A1 of FIG. 4 is more suitable than the A2 of FIG. 5.

The light emitting element 2 included in the illumination device of this invention is not confined to an incandescent lamp, but it may be a lamp of other type or a light emitting element instead of a lamp. The illumination device of this invention is also applicable to the illumination of the operation panel of electronic instruments that are not installed on vehicles.

According to this invention, as described above, it becomes possible for the automatic part mounting equipment to hold by suction the illumination device stably at the flat top surface of the cap of the light emitting element by means of a suction nozzle, and carry the device and mount it on a circuit board. By the formation of a curving surface section between the cylindrical section and flat top section of the cap, the illumination device has an improved light distribution.

What is claimed is:

1. An illumination device for mounting on a circuit board, the illumination device comprising:

a light emitting element;

a casing for supporting said light emitting element; and a cap which is fitted on said light emitting element;

wherein said cap includes an external flat top surface, a cylindrical section which surrounds said light emitting element, and a curving surface section formed between an external surface of the cylindrical section and an edge of said flat top surface;

wherein the flat top surface of the cap has a diameter which is smaller than an outer diameter of the cylindrical section; and wherein said cap includes a base section located below the cylindrical section which is received in a socket section formed on an external surface of said casing.

2. An illumination device for mounting on a circuit board, the illumination device comprising:

a light emitting element;

a casing for supporting said light emitting element; and a cap which is fitted on said light emitting element;

wherein said cap includes an external flat top surface and a cylindrical section having an outer diameter larger than a diameter of an edge of the flat top surface and covering said light emitting element, a curving surface section formed between the outer surface of the cylindrical section and the edge of the flat top surface, and a base section located below the cylindrical section which is received in a socket section formed on an external surface of said casing.

3. An illumination device for mounting on a circuit board, the illumination device comprising:

a light emitting element;

a casing for supporting said light emitting element; and a cap which is fitted on said light emitting element, wherein said cap has an external flat top surface and a cylindrical section having an outer diameter larger than a diameter of an edge of the flat top surface and covering said light emitting element, and a curving surface section formed between the outer surface of the cylindrical section and the edge of the flat top surface, the curving surface section having inner and outer surfaces formed in arcuate profiles with prescribed radiuses of curvature in a longitudinal cross section including the central axis of the cylindrical section.

4. An illumination device according to claim 3, wherein said cap has at its base section below the cylindrical section the formation of a socket section which is fitted on the external surface of said casing.

5. An illumination device according to claim 3, wherein said casing is made of hard resin, and said light emitting element is inserted and held in a cavity-shaped holding section formed in said casing.

6. An illumination device according to claim 5, wherein said casing has a through-hole formed at the bottom of the holding section and grooves which run across the bottom and side walls of said casing and merge with the through-hole, with lead terminals of said light emitting element being led out through the through-hole and seated by being bent in the grooves.

7. An illumination device according to claim 3, wherein said cap includes a base section located below the cylindrical section which is received in a socket section formed on an external surface of said casing.

* * * * *